United States Patent
Jo et al.

(10) Patent No.: US 12,237,046 B2
(45) Date of Patent: Feb. 25, 2025

(54) MEMORY SYSTEM INCLUDING AN INTERFACE CIRCUIT CONNECTING A CONTROLLER AND MEMORY

(71) Applicant: Samsung Electronics Co., Ltd., Suwon-si (KR)

(72) Inventors: Youngmin Jo, Hwaseong-si (KR); Tongsung Kim, Suwon-si (KR); Chiweon Yoon, Seoul (KR); Byunghoon Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 169 days.

(21) Appl. No.: 17/951,567

(22) Filed: Sep. 23, 2022

(65) Prior Publication Data
US 2023/0162766 A1    May 25, 2023

(30) Foreign Application Priority Data

Nov. 25, 2021  (KR) .................. 10-2021-0164104
Mar. 3, 2022   (KR) .................. 10-2022-0027356

(51) Int. Cl.
*G11C 7/00*   (2006.01)
*G11C 7/10*   (2006.01)
*G11C 7/22*   (2006.01)

(52) U.S. Cl.
CPC ............ *G11C 7/1087* (2013.01); *G11C 7/109* (2013.01); *G11C 7/1093* (2013.01); *G11C 7/222* (2013.01)

(58) Field of Classification Search
CPC .................................................. G11C 7/109
(Continued)

(56) References Cited

U.S. PATENT DOCUMENTS 7,336,554 B2   2/2008  Kim et al.
8,301,822 B2  10/2012  Pinto et al.
(Continued)

FOREIGN PATENT DOCUMENTS

EP  3907625 A1  11/2021
JP  3762643 B2   4/2006

OTHER PUBLICATIONS

Partial Search Report issued Apr. 14, 2023 by the European Patent Office for corresponding patent application EP 22208785.0.

*Primary Examiner* — Hoai V Ho
(74) *Attorney, Agent, or Firm* — Muir Patent Law, PLLC

(57) ABSTRACT

A memory system includes a plurality of memory devices, each connected to internal channels respectively including an internal data channel and an internal control channel, and each configured to perform communication based on a first interface protocol, a controller connected to an external channel including an external data channel and an external control channel and configured to perform communication based on a second interface protocol, and an interface circuit connecting the external channel to each of the internal channels. The interface circuit is configured to perform channel conversion by serializing a parallel data signal received from the controller through the external data channel and outputting the serialized signal to the internal control channel included in a first one of the internal channels, or parallelizing a signal received through the external control channel and outputting the parallelized signal to the internal data channel included in the first one of the internal channels.

18 Claims, 11 Drawing Sheets

(58) Field of Classification Search
USPC .......................................................... 365/219
See application file for complete search history.

(56) References Cited

U.S. PATENT DOCUMENTS

| | | |
|---|---|---|
| 9,263,105 B2 | 2/2016 | Jeon et al. |
| 9,298,378 B2 | 3/2016 | Eleftheriou et al. |
| 9,678,916 B2 | 6/2017 | Lum et al. |
| 10,860,518 B2 | 12/2020 | Kim et al. |
| 2021/0349660 A1 | 11/2021 | Kim et al. |
| 2022/0011974 A1* | 1/2022 | Lee .......................... G06F 1/06 |

* cited by examiner

MEMORY SYSTEM INCLUDING AN INTERFACE CIRCUIT CONNECTING A CONTROLLER AND MEMORY

CROSS-REFERENCE TO RELATED APPLICATION(S)

This application claims priority under 35 USC 119(a) to Korean Patent Application No. 10-2021-0164104 filed on Nov. 25, 2021 and No. 10-2022-0027356 filed on Mar. 3, 2022 in the Korean Intellectual Property Office, the entire disclosures of which are incorporated herein by reference.

BACKGROUND

The present inventive concept relates to a memory system including a non-volatile memory.

Recently, storage devices such as solid state drives (SSDs) have been widely used. A storage device may correspond to a memory system including a non-volatile memory such as a flash memory and a controller controlling the non-volatile memory. The non-volatile memory may transmit and receive input/output signals to and from a memory controller through predetermined pins according to an interface protocol.

For example, the non-volatile memory may receive a command and an address from the memory controller through specific input/output pins, and may transmit and receive data to and from the memory controller through the same input/output pins. According to such an interface protocol, the data may not be transferred while the command or the address is transferred, and efficiency of an input/output interface may be decreased.

Accordingly, an interface protocol capable of efficiently transferring the data between the non-volatile memory and the controller has been proposed.

SUMMARY

Example embodiments provide a memory system supporting compatibility between a controller and a non-volatile memory when the controller and the non-volatile memory support different interface protocols.

According to example embodiments, a memory system includes first non-volatile memories connected to a first internal channel, second non-volatile memories connected to a second internal channel, a memory controller controlling the first and second non-volatile memories through an external channel, and an interface circuit connecting the external channel to each of the first and second internal channels. The interface circuit includes a command latch enable (CLE) pin, an address latch enable (ALE) pin, and an external data (DQ) pin group connected to the external channel, a first command/address (CA) pin group and a first internal DQ pin group connected to the first internal channel, a decoder configured to determine whether a parallel data signal received from the external DQ pin group is a command signal, an address signal, or a real data signal based on a CLE signal and an ALE signal received from the CLE pin and the ALE pin respectively, and output a decision result signal, a first serializer configured to serialize the parallel data signal and output the serialized signal to the first internal channel through the first CA pin group, a first retimer configured to correct a timing of the parallel data signal and output the timing-corrected signal to the first internal channel through the first DQ pin group, and a first demultiplexer configured to provide the parallel data signal to either the first serializer or the first retimer based on the decision result signal of the decoder.

According to example embodiments, a memory system includes first non-volatile memories connected to a first internal channel, second non-volatile memories connected to a second internal channel, a controller configured to control the first and second non-volatile memories through an external channel, and an interface circuit connecting the external channel to each of the first and second internal channels. The interface circuit includes a CA pin group and an external DQ pin group connected to the external channel, a first CLE pin, a first ALE pin, and a first internal DQ pin group connected to the first internal channel, a de-serializer configured to generate a first parallel data signal by parallelizing a signal received from the CA pin group and outputting the first parallel data signal, a decoder configured to generate an enabled CLE signal or an ALE signal based on a signal received from the CA pin group, a first multiplexer configured to receive the first parallel data signal from the de-serializer, receive a second parallel data signal from the external DQ pin group, and output the first or second parallel data signal according to whether the CLE signal or the ALE signal has been enabled in the decoder, and a first retimer configured to correct a timing of the output first or second parallel data signal and output the timing-corrected signal to the first internal channel through the first internal DQ pin group.

According to example embodiments, a memory system includes a plurality of memory devices, each connected to internal channels respectively including an internal data channel and an internal control channel, and each configured to perform communication based on a first interface protocol, a controller connected to an external channel including an external data channel and an external control channel and configured to perform communication based on a second interface protocol, and an interface circuit connecting the external channel to each of the internal channels. The interface circuit is configured to perform channel conversion by serializing a parallel data signal received from the controller through the external data channel and outputting the serialized signal to the internal control channel included in a first one of the internal channels, or parallelizing a signal received through the external control channel and outputting the parallelized signal to the internal data channel included in the first one of the internal channels.

According to example embodiments, a semiconductor device is configured to convert communication protocols between a memory controller and a plurality of non-volatile memories. The semiconductor device includes first internal channel pins for communicating through a first internal channel to the plurality of non-volatile memory dies; second internal channel pins for communicating through a second internal channel to the plurality of non-volatile memory dies; external channel pins configured transfer control signals to and receive control signals from the memory controller through an external channel; and a circuit connecting the external channel pins to the first internal channel pins and to the second internal channel pins. The the first internal channel pins, second internal channel pins, and external channel pins further include: a CA pin group and an external DQ pin group for connecting to the external channel; a first CLE pin, a first ALE pin, and a first internal DQ pin group for connecting to the first internal channel; a de-serializer configured to generate a first parallel data signal by parallelizing a signal received from the CA pin group and outputting the first parallel data signal; a decoder configured to generate an enabled CLE signal or ALE signal based on a signal received from the CA pin group; a first multiplexer configured to receive the first parallel data signal from the de-serializer, receive a second parallel data signal from the external DQ pin group, and output the first or second parallel data signal according to whether the CLE signal or the ALE signal has been enabled in the decoder; and a first retimer configured to correct a timing of the output first or second parallel data signal and output the timing-corrected signal to the first internal DQ pin group.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
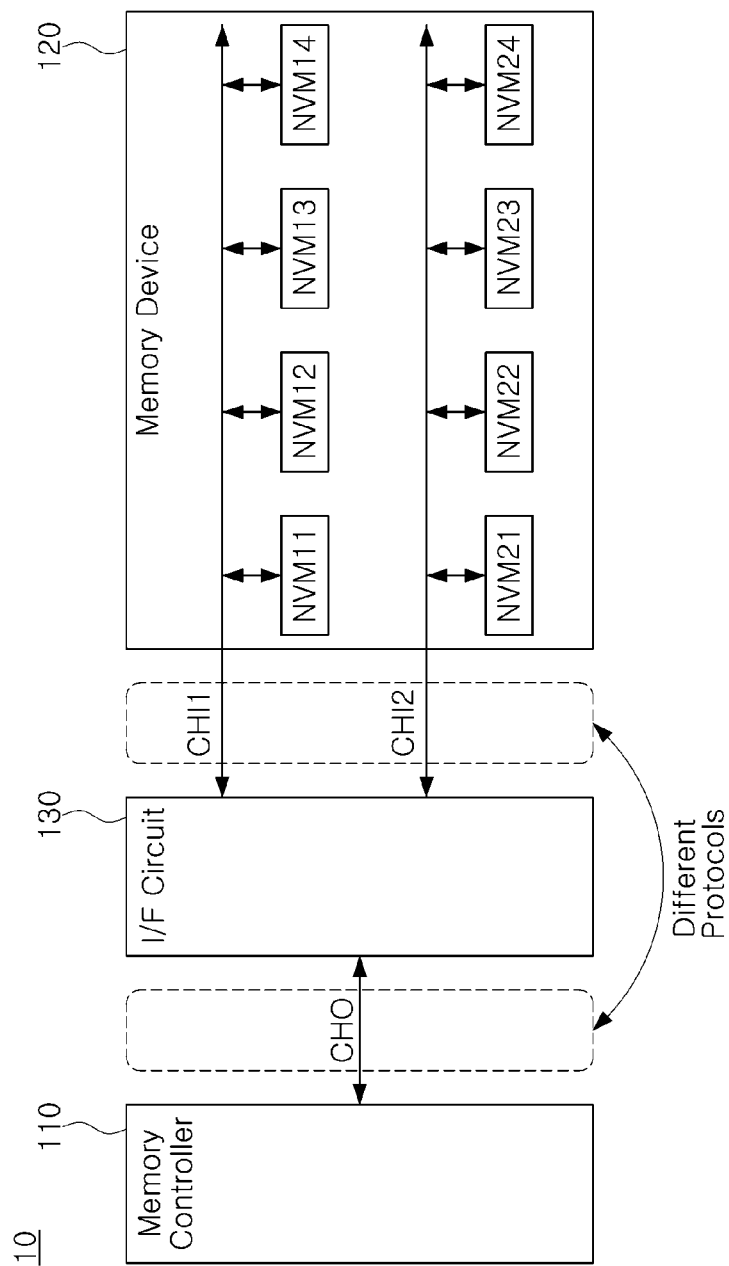
FIG. 1 is a block diagram illustrating a memory system according to example embodiments.

FIG. 1 is a block diagram illustrating a memory system according to example embodiments.

Referring to FIG. 1, a memory system 10 may include a memory controller 110, a memory device 120, and an interface circuit 130.

The memory device 120 may include a plurality of non-volatile memories NVM11 to NVM24. Each of the non-volatile memories NVM11 to NVM24 may store data at the time of a write operation and output data at the time of a read operation. Each of the non-volatile memories NVM11 to NVM24 may be a NAND flash memory, a vertical NAND (VNAND) flash memory, a NOR flash memory, a resistive random access memory (RRAM), a phase-change memory (PRAM), a magnetic random access memory (MRAM), a ferroelectric random access memory (FRAM), a spin transfer torque random access memory (STT-RAM)), or the like. Each non-volatile memory may be, for example, a semiconductor chip including a memory cell array, or a memory cell array at a particular layer or group of layers within a vertically stacked memory cell array in a semiconductor chip. The term "semiconductor device," as used herein, may refer, for example, to a device such as a semiconductor chip (e.g., memory chip, interface chip, and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. Semiconductor packages may include a package substrate, one or more semiconductor chips, and an encapsulant formed on the package substrate and covering the semiconductor chips.

The memory controller 110 may be a semiconductor device that controls a general operation of the memory device 120. For example, the memory controller 110 may store data from a host in the memory device 120 or provide data read from the memory device 120 to the host. The memory controller 110 may exchange data with the memory device 120 through an external channel CHO.

The memory device 120 may be a semiconductor device that includes first non-volatile memories NVM11 to NVM14 connected to a first internal channel CHI1 and second non-volatile memories NVM21 to NVM24 connected to a second internal channel CHI2.

FIG. 1 illustrates a case where the number of internal channels CHI1 and CHI2 is two, and four non-volatile memories are connected to each of the internal channels CHI1 and CHI2. However, the present inventive concept is not limited thereto. The number of internal channels connected to the memory device 120 may be two or more, and two or more non-volatile memories may be connected to each of the internal channels.

In accordance with the trend for a capacitance increase of the memory device 120, the number of non-volatile memories included in the memory device 120 may increase. When the memory controller 110 is connected to the plurality of non-volatile memories through a plurality of internal channels, load capacitance of the memory controller 110 for the non-volatile memories may increase. Accordingly, a distortion phenomenon of signals at the time of data read and write operations of the memory system 10 may become severe.

In order to prevent or reduce distortion of the signals, the memory system 10 may include the interface circuit 130 connecting the external channel CHO and any one of a plurality of internal channels CHI1 and CHI2 to each other at the time of the read and write operations. The interface circuit 110 may be formed as a separate semiconductor device from the memory device 120 and memory controller 130, or alternatively, the interface circuit 110 may be part of the memory device 120 or memory controller (e.g., formed on the same die). Since the memory system 10 includes the interface circuit 130, the load capacitance of the memory controller 110 may be decreased. As a result, an operating speed of the memory system 10 may increase, and distortion of data signals may be alleviated.

The memory controller 110 and the non-volatile memories NVM11-NVM24 may transmit and receive input/output signals through predetermined channels according to an interface protocol.

For example, when the non-volatile memory conforms to a first protocol, the non-volatile memory may transmit and receive a data signal through an internal data channel included in the internal channel. In addition, the non-volatile memory may receive a command signal and an address signal through the same channel as the internal data channel.

The data signal may hereinafter be referred to as a real data signal in order to be distinguished from the command signal and the address signal, where the term "real data" refers to data to be written to or read from the memory.

The internal channel may further include an internal control channel as well as the internal data channel. The non-volatile memory may receive an enable signal indicating whether a signal received from the internal data channel is a real data signal, a command signal, or an address signal through the internal control channel. According to the first protocol, the real data signal may not be transferred while the command signal or the address signal is transferred and the control channel only serves to transmit the enable signal, and data transmission efficiency of the internal channel may thus be decreased.

Accordingly, a second protocol capable of efficiently transferring the data between the non-volatile memory and the controller may be used. When the non-volatile memory conforms to the second protocol, the non-volatile memory may receive the command signal and the address signal through the internal control channel, and may transmit and receive the real data signal through the internal data channel. Since the channel for receiving the command signal and the address signal and the channel for transmitting and receiving the real data signal are separated from each other, the real data signal may be transmitted and received simultaneously with the reception of the command signal or the address signal.

The memory controller and the non-volatile memories constituting the memory system may support different interface protocols. For example, the memory controller may support the first protocol, and the non-volatile memories may support the second protocol. Conversely, the memory controller may support the second protocol, and non-volatile memories may support the first protocol.

When the memory controller and the non-volatile memories support the different interface protocols, the command signal and the address signal may need to be transmitted through different channels. For example, the command signal and the address signal output from the memory controller through the data channel may need to be input to non-volatile memories through the control channel. Accordingly, when the memory controller and the non-volatile memories support the different interface protocols, direct communication between the memory controller and the non-volatile memories may become difficult.

According to an example embodiment, the memory system may provide compatibility between the memory controller and the non-volatile memories supporting the different interface protocols using the interface circuit. The interface circuit may perform channel conversion for converting the data channel into the control channel or converting the control channel into the data channel in order to transfer the command signal or the address signal.

A memory system according to a first example embodiment will hereinafter be described in detail with reference to FIGS. 2 to 5.

Figure 2:
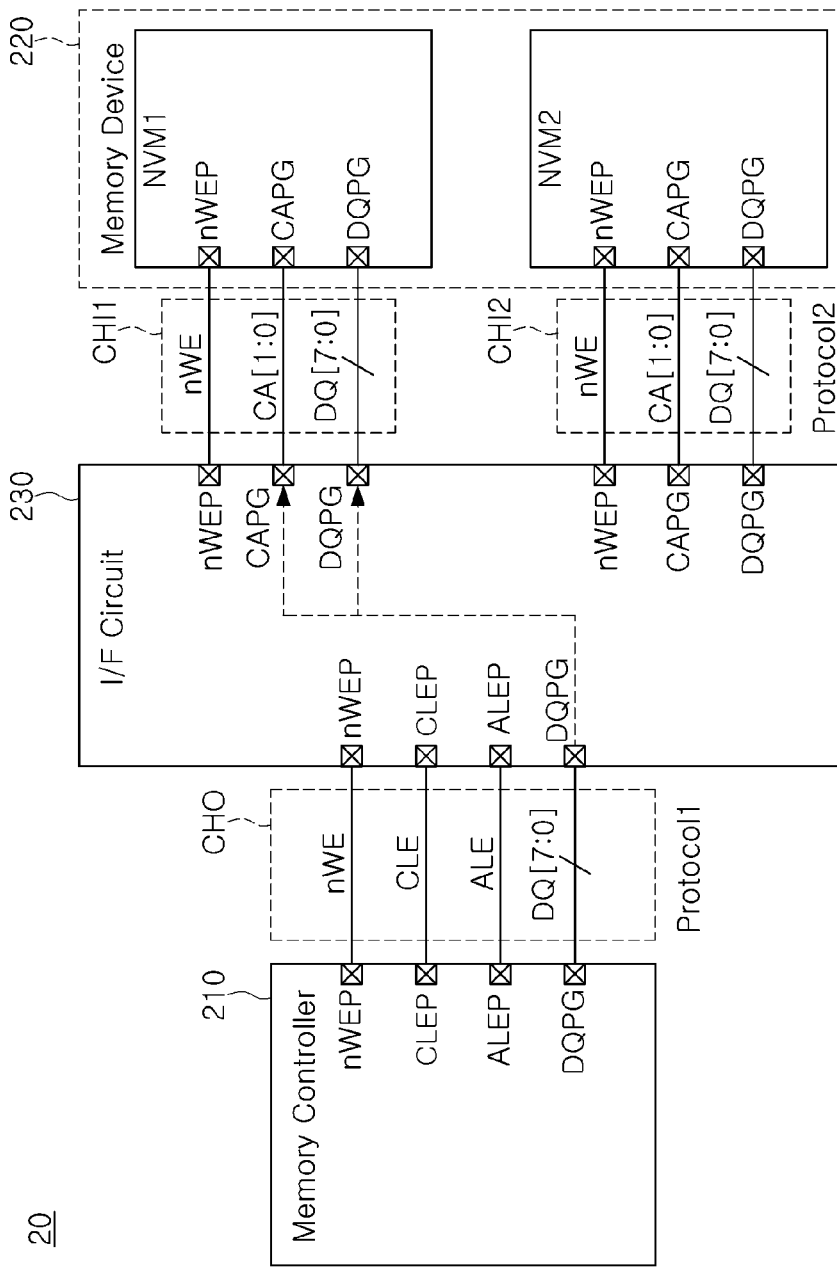
FIG. 2 is a schematic block diagram illustrating a memory system according to a first example embodiment.

FIG. 2 is a schematic block diagram illustrating a memory system according to a first example embodiment.

Referring to FIG. 2, a memory system 20 may include a memory controller 210, a memory device 220, and an interface circuit 230. The memory controller 210, the memory device 220, and the interface circuit 230 of FIG. 2 may correspond to the memory controller 110, the memory device 120, and the interface circuit 130 described with reference to FIG. 1, respectively.

The memory device 220 may include a first non-volatile memory NVM1 connected to a first internal channel CHI1 and a second non-volatile memory NVM2 connected to a second internal channel CHI2. The first non-volatile memory NVM1 may correspond to any one of the first non-volatile memories NVM11 to NVM14 of FIG. 1, and the second non-volatile memory NVM2 may correspond to any one of the second non-volatile memories NVM21 to NVM24 of FIG. 1.

The memory controller 210 and the non-volatile memories NVM1 and NVM2 may support different interface protocols. For example, the memory controller 210 may input and output signals according to a first protocol through an external channel CHO. In addition, the non-volatile memories NVM1 and NVM2 may input/output signals according to a second protocol through the internal channels CHI1 and CHI2.

The memory controller 210 supporting the first protocol may include a DQ (data) pin group DQPG, a command latch enable (CLE) pin CLEP, an address latch enable (ALEP) pin (LEP), and a write enable (nWE) pin nWEP that are connected to the external channel CHO. A pin refers to an external connection terminal disposed to receive signals from inside of a first component (e.g., memory controller 210, I/F circuit 230, or memory device 220), and transmit the signals to a second component, or vice versa. A pin may be formed of a conductive lead, a pad, a bump or ball, or other conductive component to which a wire, such as a bonding wire or other wire, may be connected.

The external channel CHO may include an external data channel for inputting and outputting a parallel data signal DQ[7:0] through the DQ pin group DQPG, an external control channel for outputting a CLE signal and an ALE signal through the CLE pin CLEP and the ALE pin ALEP, and an external clock channel for outputting a clock signal through the nWE pin nWEP.

The parallel data signals DQ[7:0] output through the DQ pin group DQPG may be a real data signal or may be a command signal or an address signals. The CLE signal and the ALE signal may be output simultaneously with the parallel data signal DQ[7:0]. The CLE signal may indicate whether or not the parallel data signal DQ[7:0] is the command signal, and the ALE signal may indicate whether or not the parallel data signal DQ[7:0] is the address signal.

Each of the non-volatile memories NVM1 and NVM2 supporting the second protocol may include a DQ pin group DQPG, a CA pin group CAPG, and an nWE pin nWEP connected to each of the internal channels CHI1 and CHI2.

For example, the first internal channel CHI1 connected to the first non-volatile memory NVM1 may include a first internal data channel for inputting and outputting a parallel data signal DQ[7:0] through the DQ pin group DQPG, a first internal control channel for inputting and outputting a command/address signal through the CA pin group CAPG, and a first internal clock channel for outputting a clock signal through the nWE pin nWEP.

The parallel data signal DQ[7:0] received by the first non-volatile memory NVM1 through the DQ pin group DQPG may be a real data signal, and a signal received by the first non-volatile memory NVM1 through the CA pin group CAPG may be a command signal or an address signal.

The interface circuit 230 may connect any one of the internal channels CHI1 and CHI2 to the external channel CHO according to a chip selection signal. The chip selection signal may be a chip enable signal received through a chip enable (nCE) chip (not illustrated) of the interface circuit 230. The interface circuit 230 may convert the signal received from the memory controller 210 according to the first protocol into a signal according to the second protocol, and provide the converted signal to a non-volatile memory selected by the chip selection signal, of the non-volatile memories NVM1 and NVM2.

When the interface circuit 230 converts a signal according to the first protocol into the signal according to the second protocol, channel conversion may occur. For example, when the parallel data signal received through the external data channel is the command signal or the address signal, channel conversion may occur so that the parallel data signal is transmitted to the internal control channel.

According to an example embodiment, even though the memory controller may be an older controller that does not support the second protocol, a memory system in which the memory controller is combined with non-volatile memories supporting the second protocol may be configured. That is, compatibility between the non-volatile memories and the controller may be improved, and versatility of the non-volatile memories may be increased.

Figure 3:
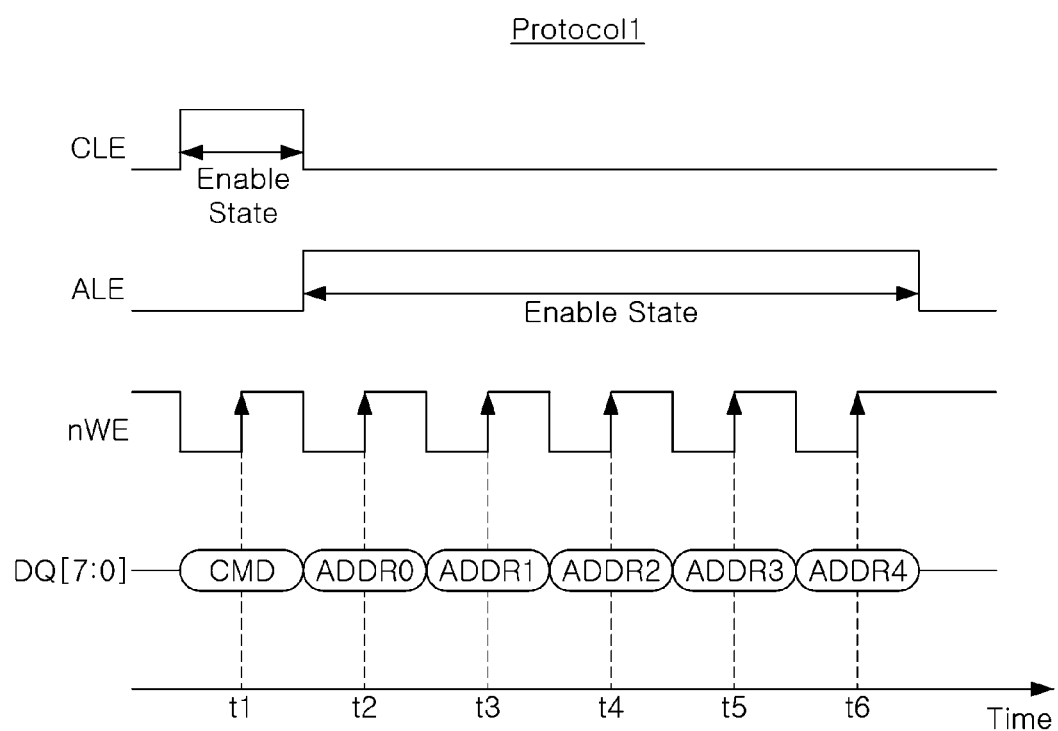
FIG. 3 is a timing chart illustrating an example of receiving a command/address according to a first protocol.
Figure 4:
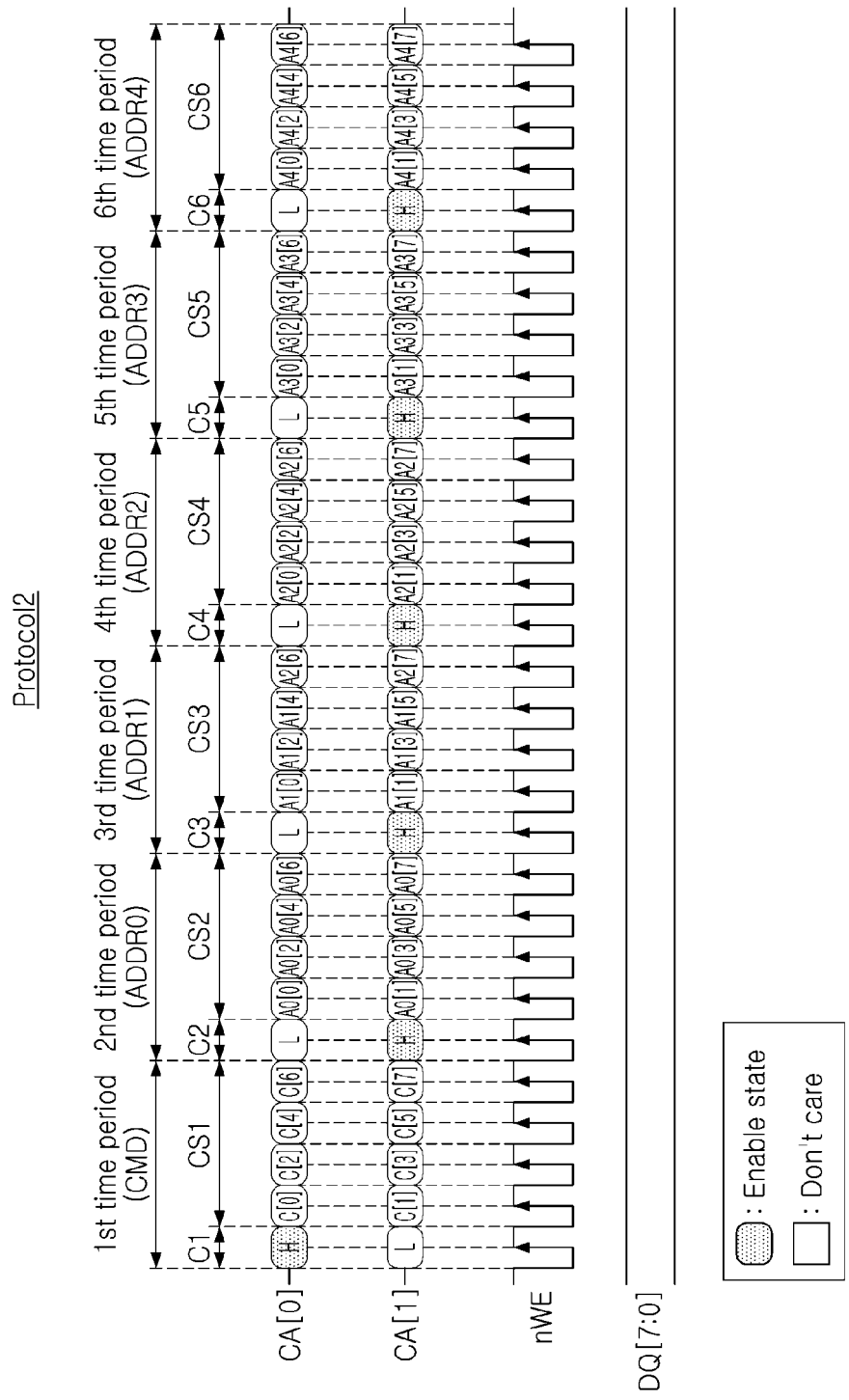
FIG. 4 is a timing chart illustrating an example of receiving a command/address according to a second protocol.

Hereinafter, reception of a command signal and an address signal according to a first protocol and a second protocol will be described in more detail with reference to FIGS. 3 and 4. FIG. 3 is a timing chart illustrating an example in which an interface circuit receives a command signal or an address signal from a memory controller according to a first protocol. FIG. 4 is a timing chart illustrating an example in which a non-volatile memory receives the command signal or the address signal from the interface circuit according to a second protocol.

Specifically, FIGS. 3 and 4 illustrate a case where the interface circuit 230 receives a command signal CMD and address signals ADDR0 to ADDR4 from the memory controller 210, and outputs the command signal CMD and the address signals ADDR0 to ADDR4 to the selected non-volatile memory. For example, the address signals ADDR0 and ADDR1 may indicate column addresses, and the address signals ADDR2 to ADDR4 may indicate row addresses. However, the present inventive concept is not limited thereto, and this is merely one example of address signals.

Referring to FIGS. 2 and 3, the interface circuit 230 may receive the parallel data signals DQ[7:0] indicating the command CMD and the addresses ADDR0 to ADDR4 through the DQ pin group DQPG according to the first protocol. While the parallel data signal DQ[7:0] is being received, the interface circuit 230 may receive a toggling clock signal from the nWE pin nWEP. For example, the interface circuit 230 may receive a clock signal starting toggling in a fixed state (e.g., a high level) before receiving the parallel data signal DQ[7:0] from the DQ pin group DQPG.

The interface circuit 230 may obtain the command CMD from the parallel data signal DQ[7:0] in an enable period of the CLE signal, and obtain the addresses ADDR0 to ADDR4 from the parallel data signal DQ[7:0] in an enable period of the ALE signal. For example, the interface circuit 230 may obtain the command CMD and the addresses ADDR0 to ADDR4 by sampling the parallel data signal DQ[7:0] at rising edges of the clock signal. For example, the command CMD may include signal values of the parallel data signal DQ[7:0] at a first point in time t1, and each of the addresses ADDR0 to ADDR4 may include signal values of the parallel data signal DQ[7:0] at each of second to sixth points in time t2 to t6.

Meanwhile, although not illustrated in FIG. 3, the interface circuit 230 may obtain real data from the parallel data signal DQ[7:0] in a period in which both the CLE signal and the ALE signal are disabled.

Referring to FIGS. 2 and 4, the non-volatile memory may receive a command signal including a command CMD and address signals including addresses ADDR0 to ADDR4 through a CA pin group CA[1:0] according to the second protocol. While the command signal or the address signal is being received, the non-volatile memory may receive a toggling clock signal through the nWE pin nWEP. A toggling frequency of the clock signal received by the non-volatile memory according to the second protocol may be higher than a toggling frequency of the clock signal received by the interface circuit 230 according to the first protocol.

A period in which the command signal and the address signals are received may be divided into a plurality of time periods based on the clock signal. Each of the plurality of time periods may be defined as a predetermined number of cycle periods. One cycle period may correspond to one or more cycles of the clock signal. For example, as illustrated in FIG. 4, a period in which the command CMD and addresses ADDR0 to ADDR4 are received may be divided into first to sixth time periods, and each of the first to sixth time periods may include five cycle periods. In this case, one cycle period may correspond to one cycle of the clock signal.

The non-volatile memory may obtain a command or an address from the command/address signal received in a defined time period. When a signal CA[0] received in a specific cycle period in the defined time period is in an enable state (H: high level), the non-volatile memory may obtain a command CMD from a command/address signal CA[1:0]) received in the defined time period. When a signal CA[1] received in a specific cycle period in the defined time period is in an enable state (H), the non-volatile memory may obtain an address ADDR from a command/address signal CA[1:0]) received in the defined time period.

For example, when a command signal CA[0] received during a first cycle period C1 in a first time period is in an enable state H, the non-volatile memory may obtain the command CMD from a command/address signal CA[1:0] received during the remaining cycle periods CS1 of the first time period (e.g., may process the data received during the remaining cycle periods CS1 as command signals or bits). In this case, a signal CA[1] received during the first cycle period C1 may be in a disable state (L: low level). The first cycle period C1 may correspond to a first rising edge of the clock signal when a clock signal is changed from a fixed state to a toggled state, but the present inventive concept is not limited thereto. A rising edge of the clock signal corresponding to the first cycle period C1 may vary depending on a protocol. The non-volatile memory may obtain the command CMD from eight signal values C[0] to C[7] of the command/address signal CA[1:0] sampled at a rising edge of the clock signal during the remaining cycle periods CS1. The eight signal values C[0] to C[7] may correspond to signal values of the parallel data signal DQ[7:0] sampled at the first point in time t1 of FIG. 3.

When an address signal CA[1] received during a second cycle period C2 in a second time period is in an enable state H, the non-volatile memory may obtain the address ADDR0 from a command/address signal CA[1:0] received during the remaining cycle periods CS2 of the second time period (e.g., may process the data received during the remaining cycle periods CS2 as address bits). In this case, a command signal CA[0] received during the second cycle periods C2 may be in a disable state (L). The non-volatile memory may obtain the address ADDR0 from eight signal values A0[0] to A0[7] of the command/address signal CA[1:0] sampled at a rising edge of the clock signal in the remaining cycle periods CS2 of the second time period. The eight signal values A0[0] to A0[7] may correspond to signal values of the parallel data signal DQ[7:0] sampled at the second point in time t2 of FIG. 3. Similarly, the non-volatile memory may obtain the addresses ADDR1 to ADDR4 from command/address signals CA[1:0] received in third to sixth time periods. For ease of explanation, for each time period, the period in which the first rising edge of the toggling clock signal is received may be referred to as a first cycle period of that time period, the period in which the second rising edge of the toggling clock signal is received may be referred to as a second cycle period of that time period, the period in which the third rising edge of the toggling clock signal is received may be referred to as a third cycle period of that time period, the period in which the fourth rising edge of the toggling clock signal is received may be referred to as a fourth cycle period of that time period, and the period in which the fifth rising edge of the toggling clock signal is received may be referred to as a fifth cycle period of that time period.

While the command/address signal CA[1:0] is being received, the parallel data signal DQ[7:0] may be treated as a don't care bit or signal. For example, the parallel data signal DQ[7:0] may have at least one of a low level, a high level, and a high resistance state (high-z). When the parallel data signal DQ[7:0] has a low level or a high level, each value of the parallel data signal DQ[7:0] may be a valid value or an invalid value.

The transmission of the signals according to the second protocol has been described by taking a case where five cycle periods are included in a time period corresponding to one command or address as an example with reference to FIG. 4. However, the present inventive concept is not limited thereto, and the number of cycle periods used to transfer one command or address according to the second protocol may vary depending on a protocol. For example, the number of cycle periods included in the defined time period may be 6 or more or be less than 5.

Figure 5:
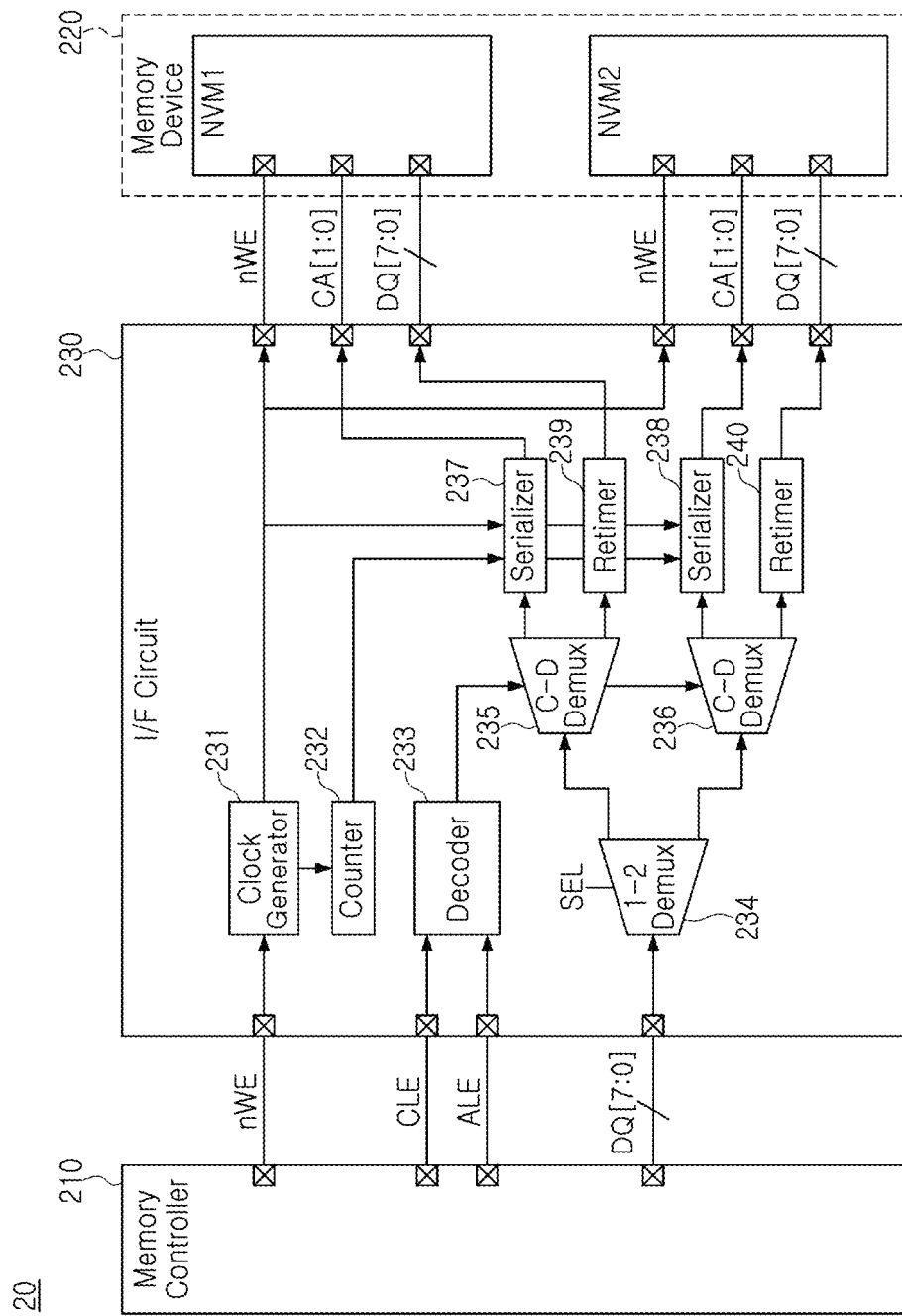
FIG. 5 is a circuit diagram illustrating the memory system according to a first example embodiment in detail.

FIG. 5 is a circuit diagram illustrating the memory system according to a first example embodiment in detail.

The memory system 20 may include a memory controller 210, a memory device 220, and an interface circuit 230. The memory controller 210, the memory device 220, and the interface circuit 230 illustrated in FIG. 5 may correspond to those illustrated in FIG. 2. Referring to FIG. 5, the interface circuit 230 may include a clock generator 231, a counter 232, a decoder 233, a chip demultiplexer 234, channel demultiplexers 235 and 236, serializers 237 and 238, and retimers 239 and 240.

Referring to FIGS. 2 and 5, an external clock signal received from the memory controller 210 through the nWE pin nWEP may be provided to the clock generator 231 and the counter 232. The CLE signal received through the CLE pin CLEP and the ALE signal received through the ALE pin ALEP may be provided to the decoder 233. In addition, the parallel data signal DQ[7:0] received through the DQ pin group DQPG may be provided to the chip demultiplexer 234.

The clock generator 231 may generate an internal clock signal having a frequency N times (N is a natural number) the frequency of the external clock signal by converting the frequency of the external clock signal, and provide the internal clock signal to the non-volatile memories NVM1 and NVM2. Here, the external clock signal may refer to a clock signal received by the interface circuit 230 according to the first protocol, and the internal clock signal may refer to a clock signal output from the interface circuit 230 according to the second protocol. A value of a multiple N of the frequency may be determined as the number of cycle periods included in the defined time period described with reference to FIG. 4. For example, N=5 in an example of FIG. 4, but the present inventive concept is not limited thereto, and the value of N may be determined differently depending on a protocol.

The counter 232 may count the number of times of the occurrence of a rising edge after the internal clock signal is changed from a fixed state to a toggled state, and may output a count value to the serializers 237 and 238. The count value may be used for the serializers 237 and 238 to identify cycle periods and defined time periods.

The decoder 233 may decide whether the parallel data signal DQ[7:0] is a command signal, an address signal, or a real data signal, based on the received CLE signal and ALE signal. For example, when the CLE signal is enabled, the parallel data signal DQ[7:0] may be decided to be the command signal, when the ALE signal is enabled, the parallel data signal DQ[7:0] may be decided to be the address signal, and when both the CLE signal and the ALE signal are disabled, the parallel data signal DQ[7:0] may be decided to be the real data signal. The decoder 233 may output a decision result signal to a selected multiplexer of the channel demultiplexers 235 and 236.

The chip demultiplexer 234 may connect the outer channel CHO to any one of the internal channels CHI1 and CHI2 by selecting one of the channel demultiplexers 235 and 236 in response to a chip selection signal SEL. The chip demultiplexer 234 may provide the parallel data signal DQ[7:0] to a selected demultiplexer of the channel demultiplexers 235 and 236. The chip selection signal SEL may be received through a separate pin not illustrated in FIG. 5, for example, an nCE pin, but the present inventive concept is not limited thereto.

When a first channel demultiplexer 235 is selected, the first channel demultiplexer 235 may provide the parallel data signal DQ[7:0] provided from the chip demultiplexer 234 to a first serializer 237 or a first retimer 239 based on the decision result signal received from the decoder 233. The decision result signal may indicate whether the parallel data signal DQ[7:0] is the command signal, the address signal, or the real data signal. The first channel demultiplexer 235 may provide the parallel data signal DQ[7:0] to the first serializer 237 when the parallel data signal DQ[7:0] is the command signal or the address signal, and provide the parallel data signal DQ[7:0] to the first retimer 239 when the parallel data signal DQ[7:0] is the real data signal. In short, the external data channel may be connected to a first internal control channel or a first internal data channel according to a selection of the first channel demultiplexer 235.

Similarly, when a second channel demultiplexer 236 is selected, the second channel demultiplexer 236 may provide the parallel data signal DQ[7:0] provided from the chip demultiplexer 234 to a second serializer 238 or a second retimer 240 based on the decision result signal received from the decoder 233. For example, the external data channel may be connected to a second internal control channel or a second internal data channel according to a selection of the second channel demultiplexer 236.

The first serializer 237 may serialize the parallel data signal DQ[7:0] received from the first channel demultiplexer 235, and output the serialized signal as a command/address signal CA[1:0] to the first non-volatile memory NVM1.

Specifically, the first serializer 237 may serialize the parallel data signal DQ[7:0] so that the parallel data signal DQ[7:0] provided from the DQ pin group DQPG including eight DQ pins may be transferred as the command/address signal CA[1:0] through the CA pin group CAPG including two CA pins.

In order for the first serializer 237 to serialize the parallel data signal DQ[7:0] and output the serialized signal, the internal clock signal from the clock generator 231 and a counter value signal from the counter 232 may be used. Specifically, the first serializer 237 may determine a defined time period and a cycle period of a command/address signal CA[1:0] to be generated using the counter value signal.

The first serializer 237 may generate the command/address signal CA[1:0] so that a flag signal is output in a specific cycle period of cycle periods of the defined time period and the serialized signal of the parallel data signal DQ[7:0] is output in the remaining cycle periods. Here, the flag signal may be a signal indicating whether the serialized signal output in the defined time period is a command signal or an address signal, like the signal output in the first cycle period C1 of FIG. 4. For example, when the serialized signal is the command signal, the flag signal may include an enabled signal CA[0] and a disabled signal CA[1].

Similarly, the second serializer 238 may serialize the parallel data signal DQ[7:0] received from the second channel demultiplexer 236, and output the serialized signal as a command/address signal CA[1:0].

The first retimer 239 may perform retiming of the parallel data signal DQ[7:0] received from the first channel demultiplexer 235, and output the retimed parallel data signal DQ[7:0] to the first non-volatile memory NVM1. For example, the first retimer 239 may receive a data strobe signal DQS corresponding to the parallel data signals DQ[7:0] using a separate pin (not illustrated in FIG. 5). The data strobe signal DQS may be a signal output together with data and toggled in response to the data.

The first retimer 239 may generate a phase delayed clock signal by delaying a phase of the data strobe signal DQS. The first retimer 239 may generate the parallel data signal DQ[7:0] in which a timing is corrected and noise is removed by sampling the parallel data signal DQ[7:0] using the phase delayed clock signal.

Similarly, the second retimer 240 may perform retiming of the parallel data signal DQ[7:0] received from the second channel demultiplexer 236, and output the retimed parallel data signal DQ[7:0] to the second non-volatile memory NVM2.

According to a first example embodiment, a signal having a frequency N times higher than that of the external clock signal received from the memory controller 210 according to the first protocol may be output as the internal clock signal to the non-volatile memory. The selected non-volatile memory may receive the command signal and the address signal according to the second protocol using the internal clock signal.

In addition, it may be decided whether the parallel data signal DQ[7:0] received from the memory controller 210 according to the first protocol is the command signal, the address signal, or the real data signal. When the parallel data signal DQ[7:0] is the command signal or the address signal, the parallel data signal DQ[7:0] may be converted into the command/address signal CA[1:0] and then output to the selected non-volatile memory. When the parallel data signal DQ[7:0] is the real data signal, the parallel data signal DQ[7:0] may be output to the selected non-volatile memory as a data signal in which timing is corrected and noise is removed.

According to a first example embodiment, when the memory controller supports the first protocol and the non-volatile memories support the second protocol, the memory system may provide compatibility between the memory controller and the non-volatile memories by performing channel conversion from the external data channel to the internal control channel using an interface chip. The interface chip may decrease the load capacitance of the memory controller, and may not only alleviate distortion of the real data signals provided to the non-volatile memories but also provide the versatility of the non-volatile memories supporting the second protocol by performing the retiming of the real data signal.

Meanwhile, a first example embodiment has been described by taking the memory system of a case where the memory controller supports the first protocol and the non-volatile memories support the second protocol as an example with reference to FIGS. 2 to 5. However, the present inventive concept is not limited thereto, and may also be applied to a case where the memory controller supports the second protocol and non-volatile memories support the first protocol.

A memory system according to a second example embodiment will hereinafter be described in detail with reference to FIGS. 6 and 7.

Figure 6:
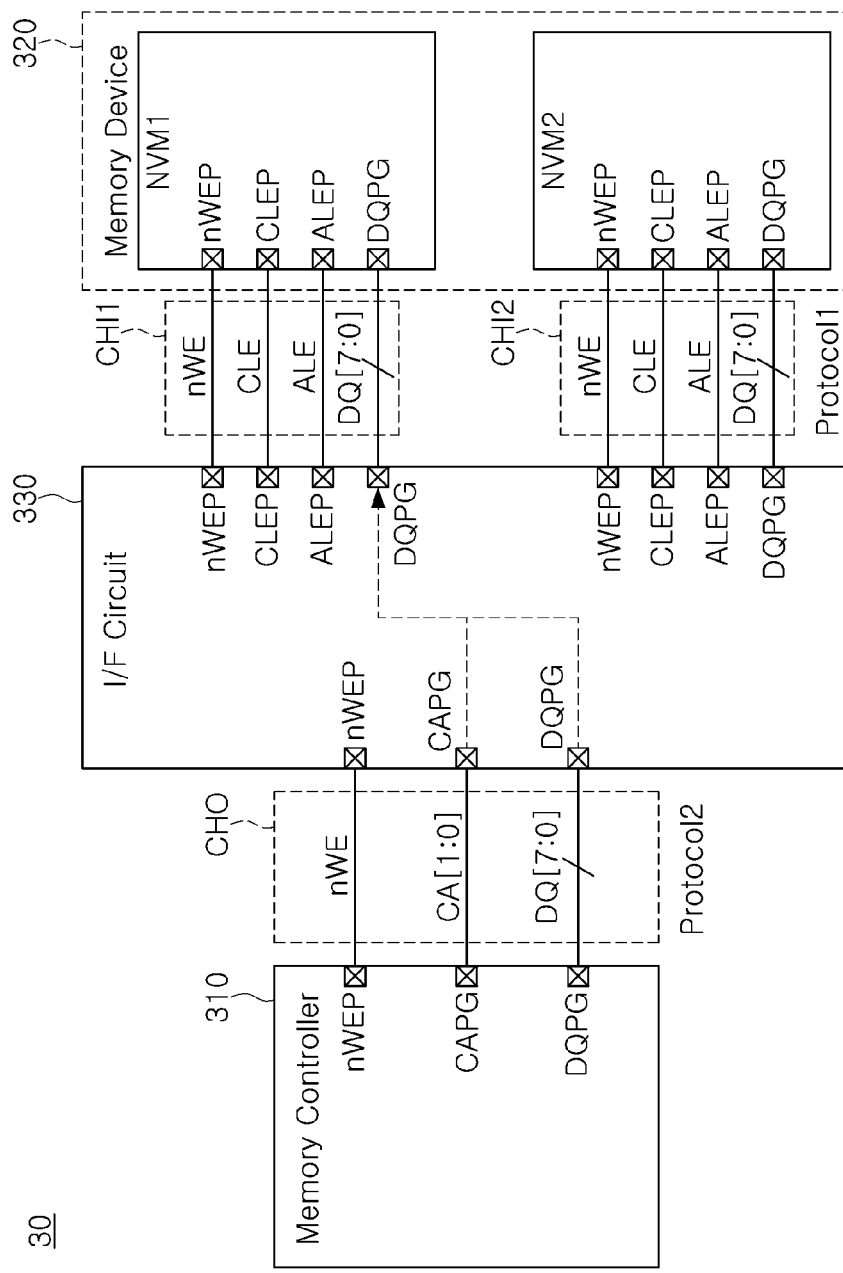
FIG. 6 is a schematic block diagram illustrating a memory system according to a second example embodiment.

FIG. 6 is a block diagram illustrating a memory system according to a second example embodiment.

Referring to FIG. 6, a memory system 30 may include a memory controller 310, a memory device 320, and an interface circuit 330. The memory controller 310, the memory device 320, and the interface circuit 330 of FIG. 6 may correspond to the memory controller 110, the memory device 120, and the interface circuit 130 described with reference to FIG. 1, respectively.

The memory device 320 may include a first non-volatile memory NVM1 connected to a first internal channel CHI1 and a second non-volatile memory NVM2 connected to a second internal channel CHI2. The first non-volatile memory NVM1 may correspond to any one of the first non-volatile memories NVM11 to NVM14 of FIG. 1, and the second non-volatile memory NVM2 may correspond to any one of the second non-volatile memories NVM21 to NVM24 of FIG. 1.

The memory controller 310 and the non-volatile memories NVM1 and NVM2 may support different interface protocols. For example, the memory controller 310 may input and output signals according to a second protocol through an external channel CHO. In addition, the non-volatile memories NVM1 and NVM2 may input/output signals according to a first protocol through the internal channels CHI1 and CHI2. The first and second protocols may correspond to the protocols described with reference to FIGS. 3 and 4.

The memory controller 310 may include a DQ pin group DQPG, a CA pin group CAPG, and an nWE pin nWEP connected to the external channel CHO. The external channel CHO may include an external data channel for inputting and outputting a parallel data signal DQ[7:0] through the DQ pin group DQPG, an external control channel for inputting and outputting a command/address signal CA[1:0] through the CA pin group CAPG, and an external clock channel for outputting a clock signal through the nWE pin nWEP. Here, the parallel data signal DQ[7:0] output from the memory controller 310 through the DQ pin group DQPG may be a real data signal.

Each of the non-volatile memories NVM1 and NVM2 supporting the first protocol may include a DQ pin group DQPG, a CLE pin CLEP, an ALE pin ALEP, and an nWE pin nWEP connected to each of the internal channels CHI1 and CHI2.

For example, the first internal channel CHI1 may include a first internal data channel for inputting and outputting a parallel data signal DQ[7:0] through the DQ pin group DQPG, a first internal control channel for outputting a CLE signal and an ALE signal through the CLE pin CLEP and the ALE pin ALEP, and an internal clock channel for outputting a clock signal through the nWE pin nWEP. The parallel data signal DQ[7:0] received by the first non-volatile memory NVM1 through the DQ pin group DQPG may include a command, an address, or real data.

The interface circuit 330 may convert the signal received from the memory controller 310 according to the second protocol into a signal according to the first protocol, and provide the converted signal to a non-volatile memory selected in response to a chip selection signal, of the non-volatile memories NVM1 and NVM2. The chip selection signal may be a chip enable signal received through an nCE chip (not illustrated) of the interface circuit 230.

When the interface circuit 330 converts a signal according to the second protocol into the signal according to the first protocol, channel conversion may occur. For example, a command/address signal received through the external control channel may be converted into the parallel data signal DQ[7:0] and then transmitted to the internal data channel.

According to an example embodiment, a memory system in which older non-volatile memories that do not support the second protocol are combined with a new memory controller supporting the second protocol may be configured. Accordingly, usability of the non-volatile memories may be increased.

Figure 7:
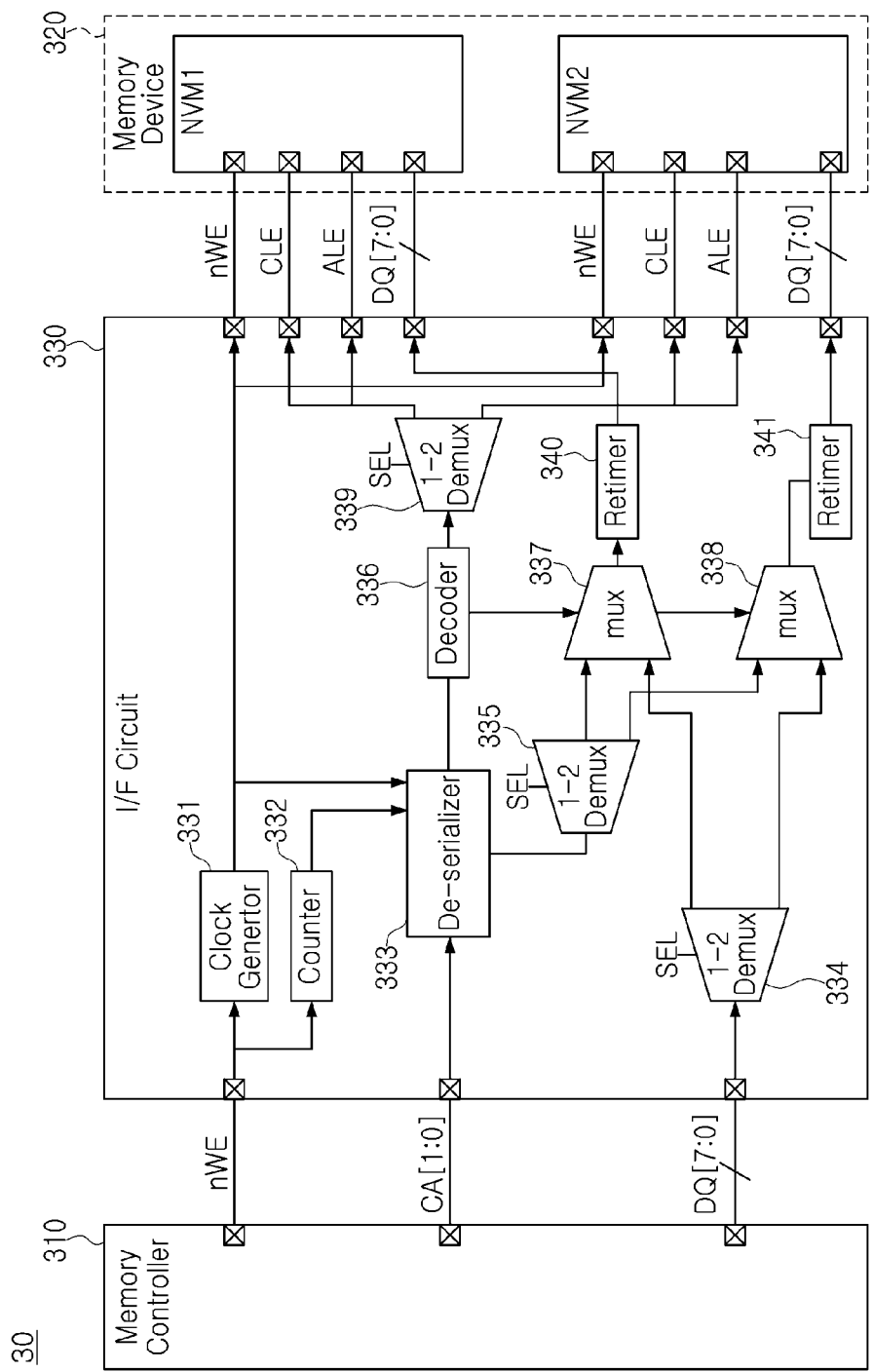
FIG. 7 is a circuit diagram illustrating the memory system according to the second example embodiment in detail.

FIG. 7 is a circuit diagram illustrating the memory system according to a second example embodiment in detail.

The memory system 30 may include a memory controller 310, a memory device 320, and a interface circuit 330. The memory controller 310, the memory device 320, and the interface circuit 330 of FIG. 7 may correspond to those illustrated in FIG. 6. Referring to FIG. 7, the interface circuit 330 may include a clock generator 331, a counter 332, a de-serializer 333, demultiplexers 334, 335, and 339, a decoder 336, multiplexers 337 and 338, and retimers 340 and 341.

Referring to FIGS. 6 and 7, an external clock signal received from the memory controller 310 through the nWE pin nWEP may be provided to the clock generator 331 and the counter 332. A command/address signals CA[1:0] received through the CA pin group CAPG may be provided to the de-serializer 333. In addition, a parallel data signal received through the DQ pin group DQPG may be provided to a first demultiplexer 334.

The clock generator 331 may generate an internal clock signal having a frequency 1/N times the frequency of the external clock signal by converting the frequency of the external clock signal, and provide the internal clock signal to the non-volatile memories NVM1 and NVM2. A value of a multiple 1/N of the frequency may be determined based on the number N of cycle periods included in the defined time period.

The counter 332 may count the number of times of the occurrence of a rising edge after the external clock signal is changed from a fixed state to a toggled state, and may output a count value signal to the de-serializer 333.

The de-serializer 333 may generate the parallel data signal DQ[7:0] based on the command/address signal CA[1:0] received from the memory controller 330. The de-serializer 333 may identify defined time periods and count periods using the counter value signal received from the counter 332.

The de-serializer 333 may output a command/address signal CA[1:0], for example, a flag signal, received in a specific cycle period of cycle periods of the defined time period to the decoder 336. In addition, the de-serializer 333 may generate the parallel data signal DQ[7:0] by parallelizing a command/address signal CA[1:0] received in the remaining cycle periods. In addition, the generated parallel data signal DQ[7:0] may be output to a second demultiplexer 335.

The first and second demultiplexers may connect the external channel CHO to any one of the internal channels CHI1 and CHI2 in response to a chip selection signal SEL. Specifically, the first demultiplexer 334 may output the parallel data signal DQ[7:0], that is, the real data signal, received through the DQ pin group DQPG to a selected multiplexer of the multiplexers 337 and 338. In addition, the second demultiplexer 335 may output the parallel data signal DQ[7:0] received from the de-serializer 333, that is, the command signal or the address signal to a selected multiplexer of the multiplexers 337 and 338. The chip selection signal SEL may be received through a separate pin not illustrated in FIG. 7, for example, an nCE pin, but the present inventive concept is not limited thereto.

The decoder 336 may output a channel selection signal to a selected multiplexer of the multiplexers 337 and 338 based on the command/address signal CA[1:0] of the specific cycle period, received from the de-serializer 333. For example, the decoder 336 may output a control channel selection signal when one of a signal CA[0] and a signal CA[1] of the specific cycle period is enabled, and output a data channel selection signal when both the signal CA[0] and the signal CA[1] of the specific cycle period are disabled.

In addition, the decoder 336 may output the command/address signal CA[1:0] of the specific cycle period to a third demultiplexer 339. For example, when the signal CA[0] of the specific cycle period is enabled and the signal CA[1] of the specific cycle period is disabled, the decoder 336 may output an enabled CLE signal and a disabled ALE signal.

A selected multiplexer of the multiplexers 337 and 338 may output any one of the signals received from the first and second demultiplexers 334 and 335 to a retimer selected based on the channel selection signal. For example, in a case where a first multiplexer 337 is selected, the first multiplexer 337 may output the real data signal received from the first demultiplexer 334 when it receives the data channel selection signal, and output the command signal or the address signal received from the second demultiplexer 335 to a first retimer 340 when it receives the control channel selection signal. Similarly, in a case where a second multiplexer 338 is selected, the second multiplexer 338 may output any one of the signals received from the first and second demultiplexers 334 and 335 based on the channel selection signal as the parallel data signal DQ[7:0] to a second retimer 341.

The third demultiplexer 339 may output the CLE signal and the ALE signal output from the decoder 336 to a selected internal channel of the internal channels CHI1 and CHI2 in response to the chip selection signal SEL.

A selected retimer of the retimers 340 and 341 may perform retiming of the parallel data signal DQ[7:0]

received from the selected multiplexer, and output the retimed parallel data signal DQ[7:0] to a selected non-volatile memory. For example, the first retimer 340 may perform retiming of the parallel data signal DQ[7:0] received from the first multiplexer 337, and output the retimed signal to the first non-volatile memory NVM1. The retimers 340 and 341 may perform retiming of the parallel data signal DQ[7:0] in a similar manner to the retimers 239 and 240 described with reference to FIG. 5.

According to a second example embodiment, the external clock signal received from the memory controller 310 according to the second protocol may be output as the internal clock signal having the frequency 1/N times the frequency of the external clock signal so that the selected non-volatile memory may receive the command, the address, and the data according to the first protocol.

In addition, the command/address signal CA[1:0] received from the memory controller 310 according to the second protocol may be converted into the CLE signal, the ALE signal, and the parallel data signal DQ[7:0], and the converted signals may be output to the selected non-volatile memory. Accordingly, the signal received through the external control channel may be output to the selected internal data channel through the interface circuit 330.

According to a second example embodiment, when the memory controller supports the second protocol and the non-volatile memories support the first protocol, the memory system may provide compatibility between the memory controller and the non-volatile memories by performing channel conversion from the external control channel to the internal data channel using an interface chip. Accordingly, the usability of the non-volatile memory supporting the first protocol may be improved.

Specific examples of a system to which example embodiments are applied will be described with reference to FIGS. 8 to 11.

Figure 8:
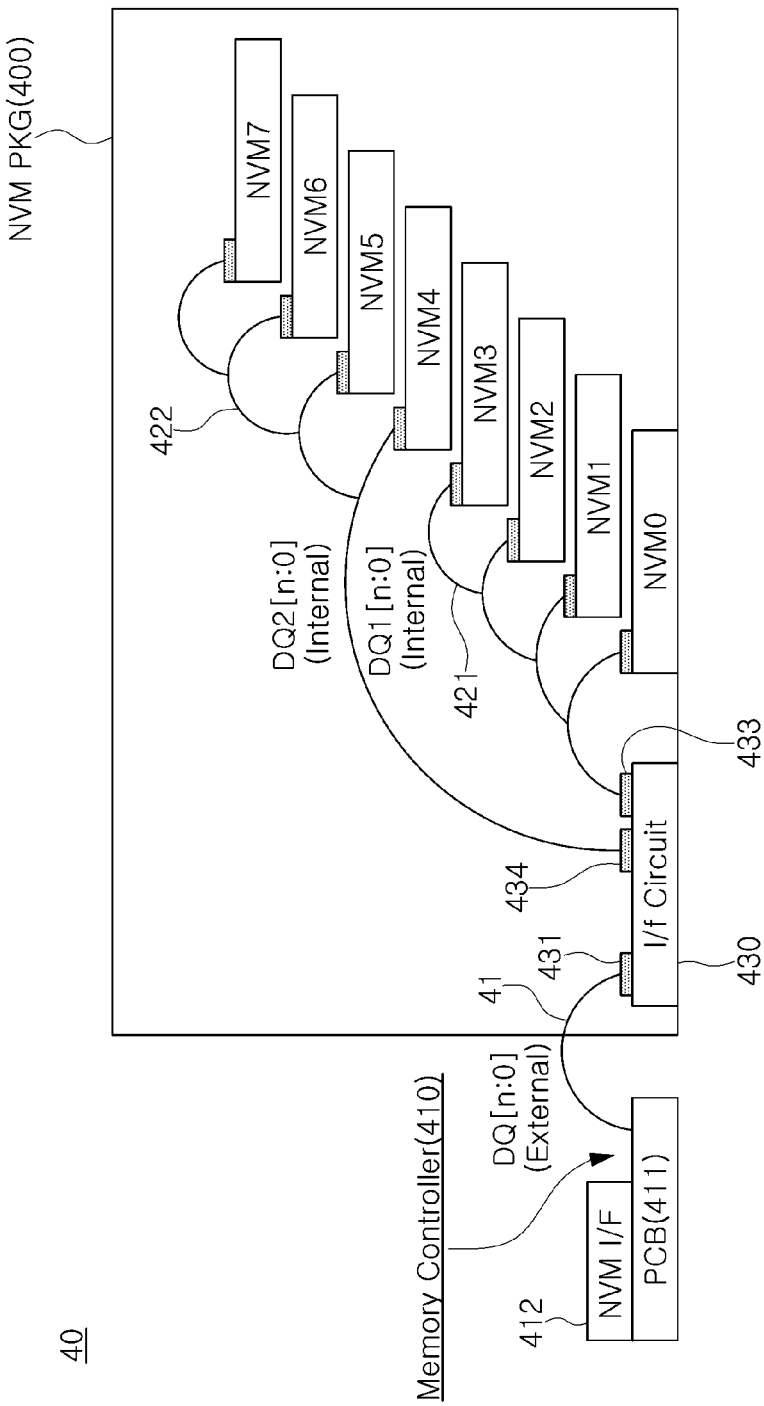
FIG. 8 is a diagram illustrating a structure of a memory system according to example embodiments.

FIG. 8 is a diagram illustrating a structure of a memory system according to example embodiments. Referring to FIG. 8, a memory system 40 may include a memory controller 410 and a non-volatile memory package 400.

The non-volatile memory package 400 may include an interface circuit 430 and non-volatile memories NVM0 to NVM7. The interface circuit 430 may connect the memory controller 410 and any one of the first and second internal data channels 421 and 422 to each other through an external channel 41. For example, the interface circuit 430 may receive a control signal from the memory controller 410, transmit the received control signal to the non-volatile memories NVM0 to NVM7, and input and output data signals corresponding to the received control signal to and from the non-volatile memories NVM0 to NVM7.

In an example embodiment, at the time of a write operation, data signals DQ[n:0] may be output as first internal data signals DQ1[n:0] and second internal data signals DQ2[n:0] through the interface circuit 430. Here, the first internal data signals DQ1[n:0] may be transmitted to first non-volatile memories NVM0 to NVM3 connected to first internal channel 421, and the second internal data signals DQ2[n:0] may be transmitted to a second non-volatile memories NVM4 to NVM7 connected to second internal channel 422.

In an example embodiment, at the time of a read operation, any one of the first internal data signals DQ1[n:0] read from the first non-volatile memories NVM0 to NVM3 and the second internal data signals DQ2[n:0] read from the second non-volatile memories NVM4 to NVM7 may be output as the data signals DQ[n:0] through the interface circuit 430.

In an example embodiment, the data signals DQ[n:0] may be input and output through data pads 431, the first internal data signals DQ1[n:0] may be input and output through first internal data pads 433 connected to the first internal channels 421, and the second internal data signals DQ2[n:0] may be input and output through second internal data pads 434 connected to the second internal channels 422.

Each of the non-volatile memories NVM0 to NVM7 may store data at the time of a write operation and output data at the time of a read operation. Each of the non-volatile memories NVM0 to NVM7 may be a NAND flash memory, a vertical NAND (VNAND) flash memory, a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), or the like. Each of the non-volatile memories NVM0 to NVM7 may be formed on a semiconductor die and may be a semiconductor chip. The non-volatile memory package 400 may include a plurality of semiconductor memory chips stacked on each other, for example, in a staircase structure shape, and disposed horizontally adjacent to a semiconductor chip that includes the interface circuit 430. However, the invention is not limited to this embodiment. For example, non-volatile memories NVM0 to NVM7 may be stacked in other configurations (e.g., vertically aligned, stacked in two separate stacks, etc.) and the interface circuit 430 can be stacked on one or more of the non-volatile memories NVM0 to NVM7 or can be horizontally separate from the non-volatile memories NVM0 to NVM7. The non-volatile memories NVM0 to NVM7 and the interface circuit 430 may be stacked on a package substrate and covered with an encapsulant.

The non-volatile memories NVM0 to NVM7 may include the first non-volatile memories NVM0 to NVM3 connected to the first internal channels 421 and the second volatile memory devices NVM3 to NVM7 connected to the second internal channels 422.

The memory controller 410 and the non-volatile memories NVM0 to NVM7 may support different interface protocols. For example, the memory controller 410 may output a command signal, an address signal, and a real data signal through the same data channel, and output an enable signal indicating whether a signal output through the data channel is the command signal, the address signal, or the real data signal through the control channel. On the other hand, the non-volatile memories NVM0 to NVM7 may input and output only real data signals through the data channels, and may output command signals and address signals through control channels.

According to an example embodiment, the interface circuit 430 may provide compatibility between the memory controller 410 and the non-volatile memories NVM0 to NVM7 by performing channel conversion between the data channel and the control channel. When the interface circuit 430 is used, the non-volatile memory package 400 compatible with the memory controller 400 may be configured using the non-volatile memories NVM0 to NVM7 that are not compatible with the memory controller 410. Accordingly, usability of the non-volatile memories NVM0 to NVM7 may be increased.

Figure 9:
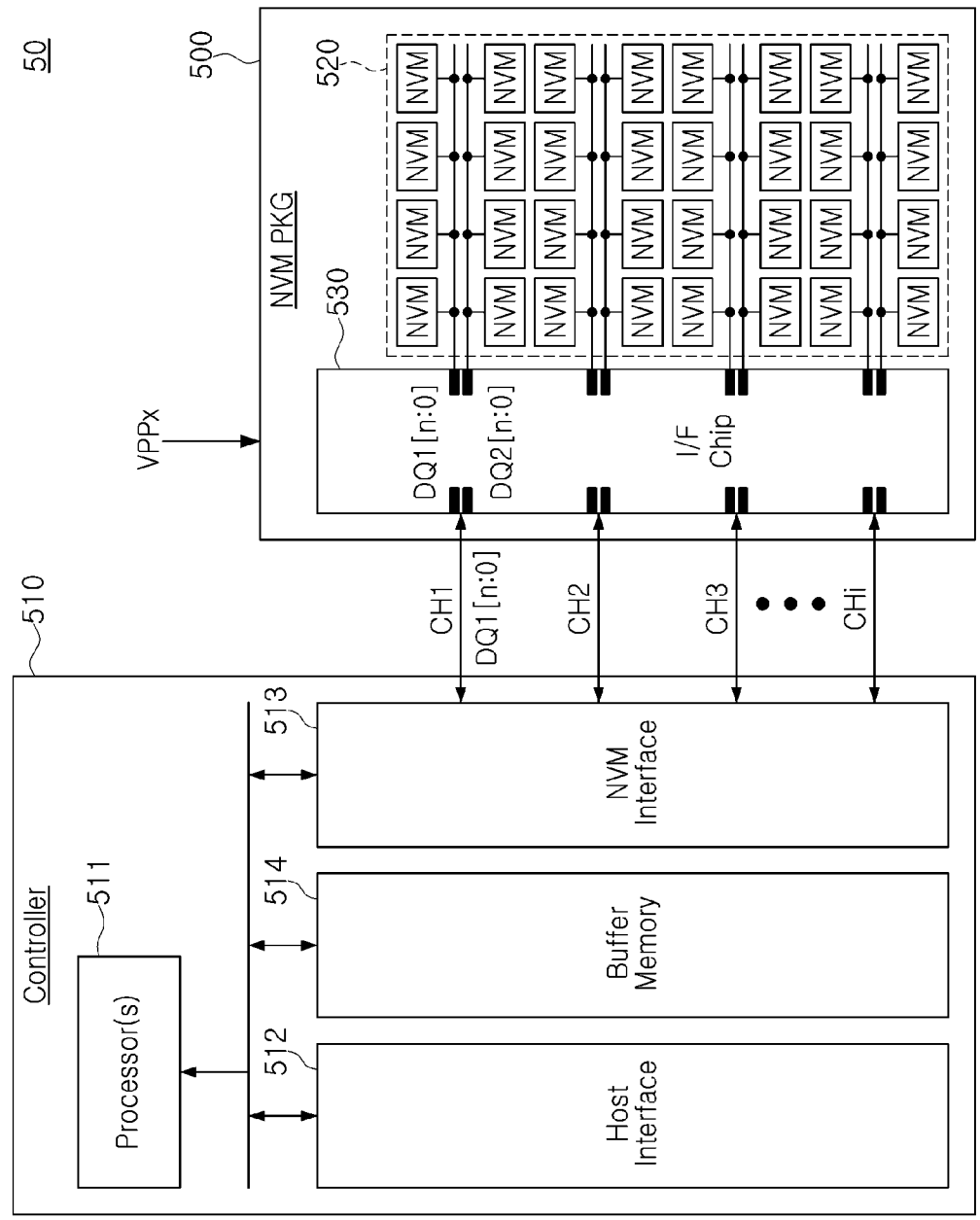
FIG. 9 is a block diagram illustrating a solid state drive (SSD) to which a memory system according to example embodiments is applied.

FIG. 9 is a block diagram illustrating a solid state drive (SSD) to which a memory system according to example embodiments is applied. An SSD 50 may include a non-volatile memory package 500 and a controller 510.

The non-volatile memory package 500 may be connected to the controller 510 through a plurality of channels CH1 to CHi (i is an integer of 2 or more). The non-volatile memory package 500 includes an interface chip 530 and a plurality of non-volatile memory groups 520. The interface chip 530 may be implemented with the same configuration and operation as the interface circuit 130, 230, or 330 described with reference to FIGS. 1 to 7 to provide protocol compatibility between the controller 510 and the non-volatile memory groups 520. The controller 510 may include at least one processor 511, a host interface 512, a non-volatile interface 513, and a buffer memory 514.

In FIGS. 8 and 9, the memory controller and the non-volatile memory package may exist as separate chips or packages, respectively. However, the present inventive concept is not limited thereto. The memory controller and the non-volatile memories may be implemented as a single chip or package on a single printed circuit board. For example, the present inventive concept may be applied to an embedded multimedia card (eMMC).

Figure 10:
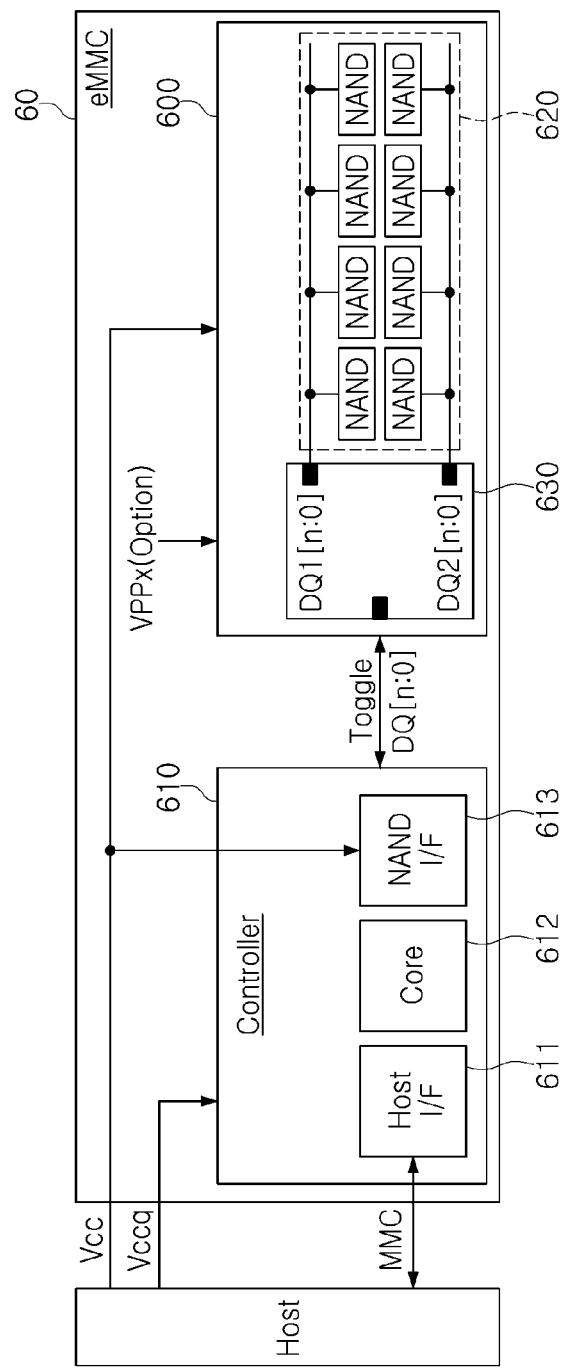
FIG. 10 is a block diagram illustrating an embedded multimedia card (eMMC) to which a memory system according to example embodiments is applied.

FIG. 10 is a block diagram illustrating an embedded multimedia card (eMMC) to which a memory system according to example embodiments is applied.

Referring to FIG. 10, an eMMC 60 may include a non-volatile memory unit 600 and a controller 610 controlling the non-volatile memory unit 600. The non-volatile memory unit 600 may be implemented with the same configuration and operation as the non-volatile memory package 400 described with reference to FIG. 8. The non-volatile memory unit 600 may include a plurality of NAND flash memory devices 620 and an interface circuit 630. The controller 610 may include a host interface circuit 611, a core 612, and a NAND interface circuit 613. The host interface circuit 611 may be implemented as an MMC interface.

The eMMC 60 may receive power supply voltages Vcc and Vccq from a host. Here, a first power supply voltage (Vcc: 3.3 V) is provided to the non-volatile memory unit 600 and the NAND interface circuit 613, and a second power supply voltage (Vccq: 1.8 V/3.3V) is provided to the controller 610. In an example embodiment, the eMMC 60 may optionally receive an external high voltage (VPPx).

The eMMC 60 according to an example embodiment may not only be advantageous in storing a large amount of data, but may also perform read/write operations at a high speed. Accordingly, the eMMC 60 according to an example embodiment may be applied to mobile products (e.g., Galaxy S®, Galaxy Note®, Galaxy Tab®, iPhone, iPad, Nexus®, etc.) requiring a small size and low power consumption.

In FIGS. 8 to 10, the interface circuit (or interface chip) and the non-volatile memories NVM0 to NVM7 have been directly connected to each other, for example, through direct electrical connections formed by wiring, and without passing through an additional interposer chip or circuit board, or additional active semiconductor components. For example, bonding wires may be directly connected to each of the interface chip and the non-volatile memories NVM0 to NVM7. However, the present inventive concept does not need to be necessarily limited thereto. An input/output buffer circuit and the non-volatile memories may also be connected to each other through a printed circuit board.

Figure 11:
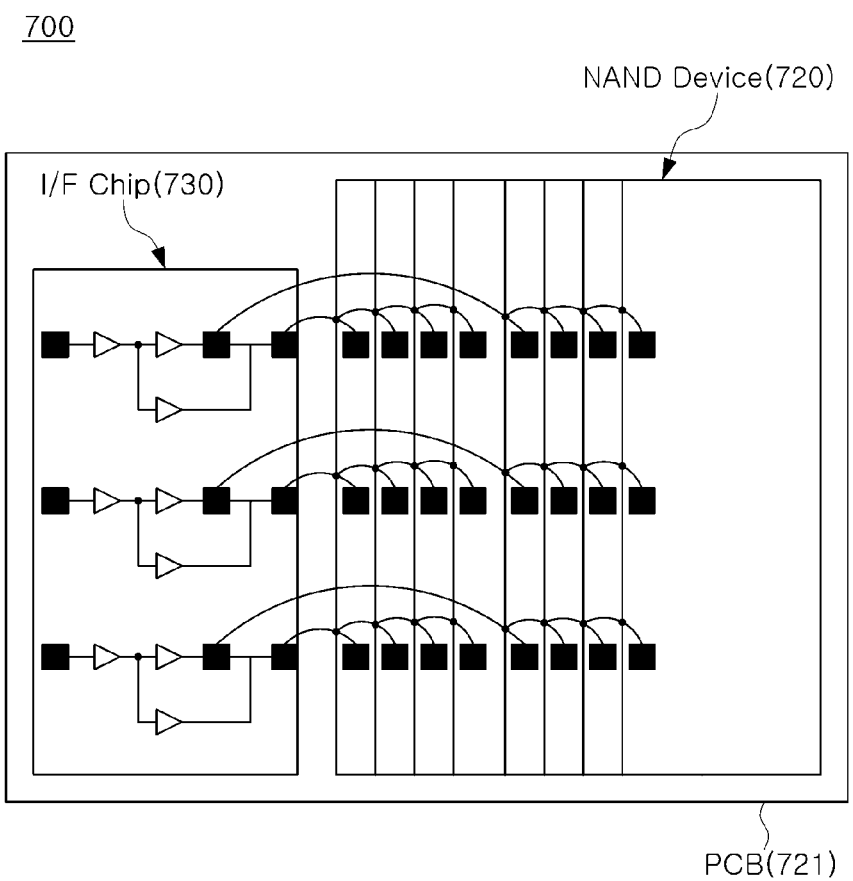
FIG. 11 is a diagram illustrating a non-volatile memory package having a side-by-side structure, which may be included in a memory system according to example embodiments.

FIG. 11 is a diagram illustrating a non-volatile memory package having a side-by-side structure, which may be included in a memory system according to example embodiments.

FIG. 11 is an illustrative diagram illustrating a non-volatile memory package 700 having a side-by-side structure. Referring to FIG. 11, the non-volatile memory package 700 includes a printed circuit board 721, an interface chip 730 and NAND device 720 including a plurality of NAND chips. The interface chip 730 and the NAND device 720 may be connected to each other through wires on the printed circuit board 721.

The interface chip 730 may provide compatibility between the NAND device 720 and an external controller in the same manner as the interface circuit 130, 230, or 330 described with reference to FIGS. 1 to 7.

The memory system according to example embodiments may provide the compatibility between the memory controller and the non-volatile memory supporting different interface protocols by performing the channel conversion between the control channel and the data channel using the interface circuit.

The memory system according to example embodiments may perform interface protocol conversion by serializing the parallel data signal provided from the memory controller and providing the serialized signal as the command/address signal to the non-volatile memory using the interface circuit.

The memory system according to example embodiments may perform interface protocol conversion by parallelizing the command/address signal provided from the memory controller and providing the parallelized signal as the command/address signal to the non-volatile memory through the data channel using the interface circuit.

The present inventive concept is not limited by the example embodiments described above and the accompanying drawings, but is intended to be limited by the appended claims. Therefore, various types of substitutions, modifications, and alterations may be made by those skilled in the art without departing from the spirit of the present inventive concept as defined by the appended claims, and these substitutions, modifications, and alterations are to be fall within the scope of the present inventive concept.

What is claimed is:
1. A memory system comprising:
first non-volatile memories connected to a first internal channel;
second non-volatile memories connected to a second internal channel;
a memory controller controlling the first and second non-volatile memories through an external channel; and
an interface circuit connecting the external channel to each of the first and second internal channels,
wherein the interface circuit includes:
a command latch enable (CLE) pin, an address latch enable (ALE) pin, and an external data (DQ) pin group, connected to the external channel;
a first command/address (CA) pin group and a first internal DQ pin group connected to the first internal channel;
a decoder configured to determine whether a parallel data signal received from the external DQ pin group is a command signal, an address signal, or a real data signal based on a CLE signal and an ALE signal received from the CLE pin and the ALE pin respectively, and output a decision result signal;
a first serializer configured to serialize the parallel data signal and output the serialized signal to the first internal channel through the first CA pin group;
a first retimer configured to correct a timing of the parallel data signal and output the timing-corrected signal to the first internal channel through the first internal DQ pin group; and a first demultiplexer configured to provide the parallel data signal to either the first serializer or the first retimer based on the decision result signal of the decoder.

2. The memory system of claim 1, wherein the interface circuit further includes:
a second CA pin group and a second internal DQ pin group connected to the second internal channel;
a second serializer configured to serialize the parallel data signal and output the serialized signal to the second internal channel through the second CA pin group;
a second retimer configured to correct a timing of the parallel data signal and output the timing-corrected signal to the second internal channel through the second internal DQ pin group;
a second demultiplexer configured to provide the parallel data signal to either the second serializer or the second retimer based on the decision result signal of the decoder; and
a third demultiplexer configured to provide the parallel data signal received from the external DQ pin group to the first demultiplexer or the second demultiplexer based on a selection signal from the memory controller.

3. The memory system of claim 2, wherein the interface circuit further includes a chip enable (nCE) pin connected to the external channel and configured to receive the selection signal for selecting the first internal channel or the second internal channel from the memory controller.

4. The memory system of claim 1, wherein the interface circuit further includes:
an external write enable (nWE) pin connected to the external channel;
a first internal nWE pin connected to the first internal channel; and
a clock generator configured to receive an external clock signal from the external nWE pin and output an internal clock signal having a frequency N times (N is a natural number) the frequency of the external clock signal to the first internal nWE pin.

5. The memory system of claim 4, wherein the frequency of the internal clock signal is determined based on the number N of cycle periods included in a defined time period when one command signal or address signal is output through the first CA pin group in the defined time period.

6. The memory system of claim 5, wherein the first serializer is configured to output the CLE signal and the ALE signal through the first CA pin group in a specific cycle period of cycle periods of the defined time period, and to output the serialized parallel data signal through the first CA pin group in the remaining cycle periods of the cycle periods.

7. The memory system of claim 1, wherein the interface circuit is configured to receive a data strobe signal together with the parallel data signal, and
the first retimer is configured to generate a phase-delayed clock signal by delaying a phase of the data strobe signal, and generate the timing-corrected signal by sampling the parallel data signal using the phase-delayed clock signal.

8. The memory system of claim 1, wherein:
the memory controller is configured to input and output signals based on a first interface protocol, and
the first and second non-volatile memories are configured to input and output signals based on a second interface protocol.

9. The memory system of claim 1, wherein the first and second non-volatile memories and the interface circuit constitute a non-volatile memory package.

10. The memory system of claim 9, wherein the memory controller and the non-volatile memory package are implemented as part of a single package formed on a printed circuit board.

11. The memory system of claim 9, wherein the memory controller and the non-volatile memory package are implemented as separate packages.

12. The memory system of claim 9, wherein the first and second non-volatile memories are configured to be stacked.

13. The memory system of claim 12, wherein the first and second non-volatile memories and the interface circuit are directly connected to each other through wire bonding.

14. A memory system comprising:
a plurality of memory devices, each connected to internal channels respectively including an internal data channel and an internal control channel, and each configured to perform communication based on a first interface protocol;
a controller connected to an external channel including an external data channel and an external control channel and configured to perform communication based on a second interface protocol; and
an interface circuit connecting the external channel to each of the internal channels,
wherein the interface circuit is configured to perform channel conversion by serializing a parallel data signal received from the controller through the external data channel and outputting the serialized signal to the internal control channel included in a first one of the internal channels, or parallelizing a serial signal received through the external control channel and outputting the parallelized signal to the internal data channel included in the first one of the internal channels.

15. The memory system of claim 14, further comprising:
for each memory device, a plurality of first pins connecting the memory device to the interface circuit through the internal channels; and
a plurality of second pins connecting the interface circuit to the controller through the external channel.

16. The memory system of claim 15, wherein:
for each memory device, the internal channels include:
a first internal data channel for inputting and outputting the serialized data signal to a first group of pins of the plurality of first pins, and
a first internal control channel for inputting control signals to a second group of pins of the plurality of first pins.

17. The memory system of claim 16, wherein:
the external channel includes:
a first external data channel for inputting and outputting the parallel data signal to a first group of pins of the plurality of second pins, and
a first external control channel for inputting control signals to a second group of pins of the plurality of second pins.

18. The memory system of claim 16, wherein the interface circuit is on an interface chip.

* * * * *